United States Patent
Ivancevic et al.

(10) Patent No.: US 9,429,636 B2
(45) Date of Patent: Aug. 30, 2016

(54) ADAPTIVE KEYHOLE COMPRESSION FOR DYNAMIC CONTRAST-ENHANCED MRI

(71) Applicant: KONINKLIJKE PHILIPS N.V., Eindhoven (NL)

(72) Inventors: Marko Kresimir Ivancevic, Den Bosch (NL); Thomas Chenevert, Ann Arbor, MI (US)

(73) Assignees: Koninklijke Philips N.V., Eindhoven (NL); The Regents of the University of Michigan, Ann Arbor, MI (US)

(*) Notice: Subject to any disclaimer, the term of this patent is extended or adjusted under 35 U.S.C. 154(b) by 0 days.

(21) Appl. No.: 14/422,035

(22) PCT Filed: Aug. 22, 2013

(86) PCT No.: PCT/IB2013/056804
§ 371 (c)(1),
(2) Date: Feb. 17, 2015

(87) PCT Pub. No.: WO2014/033596
PCT Pub. Date: Mar. 6, 2014

(65) Prior Publication Data
US 2015/0204961 A1 Jul. 23, 2015

Related U.S. Application Data

(60) Provisional application No. 61/693,446, filed on Aug. 27, 2012.

(51) Int. Cl.
A61B 5/05 (2006.01)
G01R 33/561 (2006.01)
G01R 33/56 (2006.01)
(Continued)

(52) U.S. Cl.
CPC ......... *G01R 33/5619* (2013.01); *G01R 33/341* (2013.01); *G01R 33/385* (2013.01); *G01R 33/5601* (2013.01); *G01R 33/5635* (2013.01);
(Continued)

(58) Field of Classification Search
CPC .... A61B 5/055; G01R 33/50; G01R 33/561; G01R 33/5616; G01R 33/5611
See application file for complete search history.

(56) References Cited

U.S. PATENT DOCUMENTS 7,235,972 B2 6/2007 Shah
2009/0278539 A1 11/2009 Beatty

FOREIGN PATENT DOCUMENTS

WO 0173462 A1 10/2001
WO 2009047690 A2 4/2009

OTHER PUBLICATIONS

Ji, Jim et al "Dynamic MRI with Compressed Sensing Imaging using Temporal Correlations", Biomedical Imaging: From Nano to Macro, 2008, pp. 1613-1616.
(Continued)

*Primary Examiner* — Joel Lamprecht

(57) ABSTRACT

A magnetic resonance imaging system (3) includes a sequence control unit (18), a sampling unit (26), and a control unit (24). The sequence control unit (18) controls a magnetic resonance scanner (4) to acquire compressed magnetic resonance data from an imaged region of a subject. The sampling unit (26) determines a change in a concentration of a contrast agent present in the image region of the subject based on magnetic resonance signals received by a radio frequency receiver. The control unit (24) adjusts a degree of compression of the acquired magnetic resonance data based on the determination made by the sampling unit (26).

17 Claims, 4 Drawing Sheets

Figure 1:
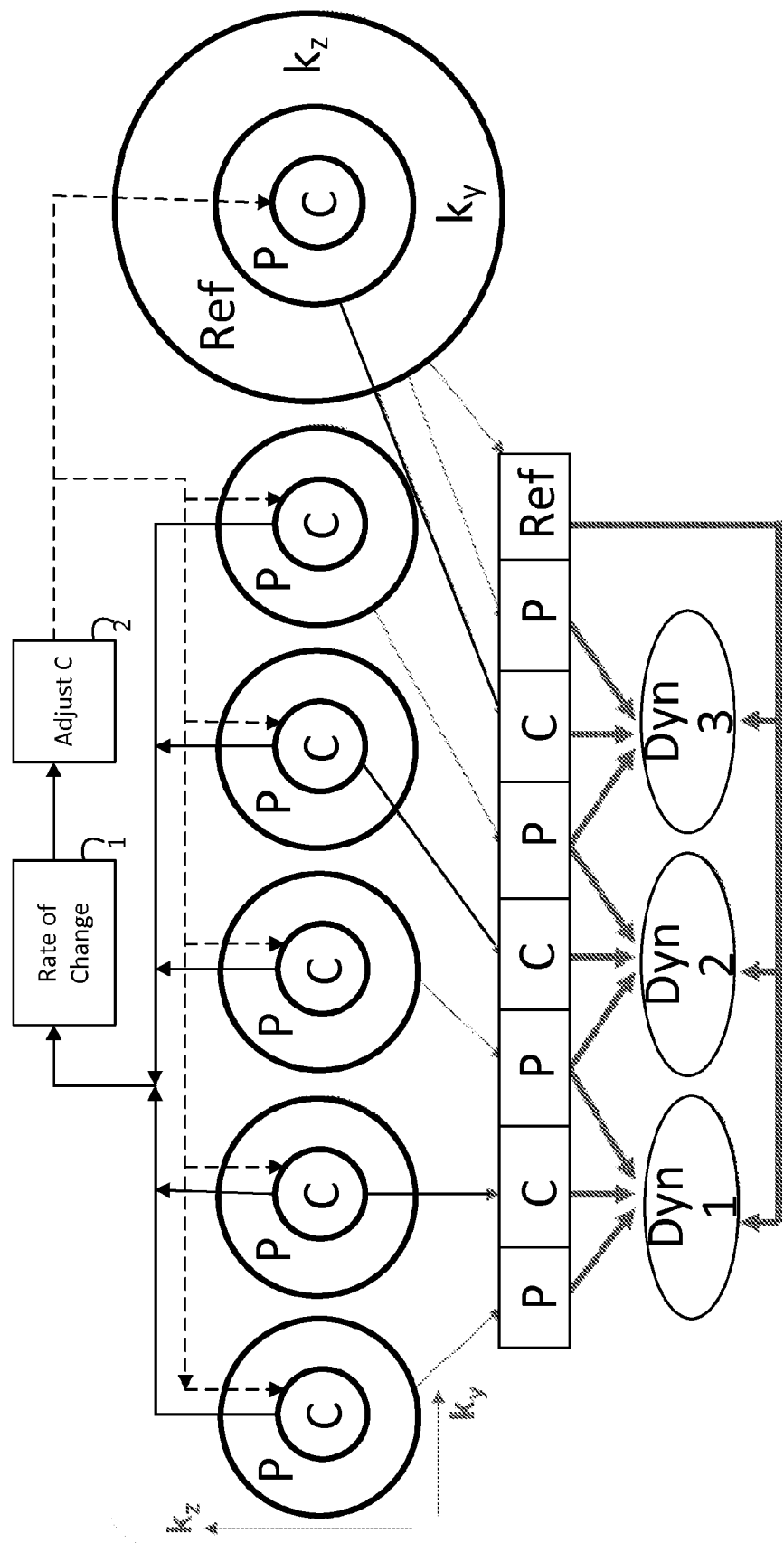

(51) Int. Cl.
*G01R 33/341* (2006.01)
*G01R 33/385* (2006.01)
*G01R 33/563* (2006.01)
*G01R 33/48* (2006.01)

(52) U.S. Cl.
CPC ..... *G01R 33/56316* (2013.01); *G01R 33/4818* (2013.01)

(56) References Cited

OTHER PUBLICATIONS

Otazo, R. et al "Adaptive Compressed Sensing MRI", Proceedings of the International Society for Magnetic Resonance in Medicine, 2010, pp. 4867.

Ravishankar, Saiprasad et al "Adaptive Sampling Design for Compressed Sensing MRI", Engineering in Medicine and Biology Society, EMBC, 2011.

Lustig, Michael et al "Sparse MRI: The Application of Compressed Sensing for Rapid MR Imaging", Magnetic Resonance in Medicine, vol. 58, 2007, pp. 1182-1195.

Chen, Zhaolin et al "Adaptive Keyhole Methods for Dynamic Magnetic Resonance Image Reconstruction", Science Direct Computerized Medical Imaging and Graphics, vol. 31, 2007, pp. 458-468.

Gamper, Urs et al "Compressed Sensing in Dynamic MRI", Magentic Resonance in Medicine, vol. 59, 2008, pp. 365-373.

Liang, Dong et al "K-t ISD: Dynamic Cardiac MR Imaging using Compressed Sensing with Iterative Support Detection", Magnetic Resonance in Medicine, vol. 68, 2012, pp. 41-53.

Tsao, Jeffrey et al "k-t BLAST and k-t SENSE: Dynamic MRI with High Frame Rate Exploiting Spatiotemporal Correlations", Magnetic Resonance in Medicine, vol. 50, 2003, pp. 1031-1042.

Krishnan, Sumati et al "Spatio-Temporal Bandwidth-Based Acquisition for Dynamic Contrast-Enhanced Magnetic Resonance Imaging" Journal of Magnetic Resonance Imaging, vol. 20, 2004, pp. 129-137/.

Van Vaals, Joop J. et al "Keyhole Method for Accelerating Imaging of Contrast Agent Uptake", Journal of Magnetic Resonance Imaging, vol. 3, No. 4, 1993, pp. 671-675.

Korosec, Frank R. et al "Time-Resolved Contrast-Enhanced 3D MR Angiography", Magnetic Resonance in Medicine, vol. 36, 1996, pp. 345-351.

Willinek, Winfried A. et al "4D Time-Resolved MR Angiography with Keyhole (4D-TRAK): More than 60 Times Accelerated MRA using a Combination of CENTRA, Keyhole, and SENSE at 3.0T", Jounnal of Magnetic Resonance Imaging, vol. 27, 2008, pp. 1455-1460.

Coenegrachts, Kenneth et al "Perfusion Maps of the Whole Liver based on High Temporal and Spatial Resolution Contrast-Enhanced MRI (4D THRIVE): Feasibility and Initial Results in Focal Liver Lesions", European Journal of Radiology, vol. 74, 2010, pp. 529-535.

Pinto, Christina et al "Time-Resolved MR Angiography with Generalized Autocalibrating Partially Parallel Acquisition and Time-Resolved Echo-Sharing Angiographic Technique for Hemodialysis Arteriovenous Fistulas and Grafts", Journal Vascular Radiology, vol. 17, 2006, pp. 1003-1009.

Beck, G.M. et al "Ultra-Fast Time Resolved Contrast Enhanced Abdominal Imaging using an Elliptical Centric Fat Suppressed 3D Profile Sharing Acquisition Technique, SENSE and Partial Fourier", Proceedings of the International Society on Magnetic Resonance in Medicine, vol. 16, 2008, pp. 2622.

Lim, R.P. et al "3D Time-Resolved MR Angiography (MRA) of the Carotid Arteries with Time-Resolved Imaging with Stochastic Trajectories: Comparison with 3D Contrast-Enhanced Bolus-Chase MRA and 3D Time-of-Flight MRA", AJNR America Journal Neuroradiology, vol. 29, 2008, pp. 1847-1854.

Hadizadeh, Dariusch R. et al "View-Sharing in Keyhole Imaging: Partially Compressed Central k-Space Acquisition in Time-Resolved MRA at 3.0T", European Journal of Radiology, vol. 80, 2011, pp. 400-406.

ADAPTIVE KEYHOLE COMPRESSION FOR DYNAMIC CONTRAST-ENHANCED MRI

CROSS-REFERENCE TO PRIOR APPLICATIONS

This application is the U.S. National Phase application under 35 U.S.C. §371 of International Application No. PCT/IB2013/056804, filed on Aug. 22, 2013, which claims the benefit of U.S. Provisional Patent Application No. 61/693,446, filed on Aug. 27, 2012. These applications are hereby incorporated by reference herein.

The following relates generally to medical imaging. It finds particular application in conjunction with Magnetic Resonance (MR) imaging, MR angiography, and Dynamic Contrast Enhanced MR, and will be described with particular reference thereto. However, it will be understood that it also finds application in other usage scenarios and is not necessarily limited to the aforementioned application.

Dynamic contrast enhanced MR Imaging images the spread of a contrast agent in the body of a subject. A contrast agent which contrasts in MR systems is injected into the subject. As the contrast agent moves throughout the imaging region, images are taken in sequence, which show the movement of the contrast agent in the systems of the body over time. Dynamic contrast enhanced MRI is useful for lesion detection, tumor staging and/or growth, measuring vascular volume and/or leakage, angiography, etc. Some procedures/protocols are of a short duration which can be in seconds to several minutes of useful imaging information while the contrast agents moves through the region of interest. The procedures/protocols are not easily repeatable due to wash rates, toxicity, etc.

A trade-off exists between spatial and temporal resolution of images in a dynamic contrast enhanced MRI. For example, when many lines of k-space are generated for reconstruction into each image, the spatial resolution of each image is high, but the temporal resolution is low. When few lines of k-space are reconstructed into each image, the temporal resolution is high, but the spatial resolution is low.

One approach to resolving the spatial and temporal resolution with MR involves sharing of k-space. MR scanners typically acquire magnetic resonance signals or data at a fixed rate. By sharing k-space and interleaving central and peripheral portions of k-space, not all portions of k-space need to re-acquired for each reconstructed image. A central portion of k-space or a keyhole can be re-acquired for each image and outer or peripheral portions re-acquired less frequently. The peripheral portions of k-space can be reused or shared between image reconstructions through interleaving, which provide the necessary temporal resolution with the central k-space portion. Sharing the peripheral portions of k-space provides some spatial resolution and improves the time between images. Temporal resolution shows the progression or movement of the contrast agent with successive images at a greater frequency or compressed time. The greater the peripheral portions of k-space are sampled, the greater the detail, but the less frequent the images. Maximizing spatial resolution is desirable within the constraints of temporal resolution. Currently, some MR systems provide a parameter such as a compression percentage which is fixed and determines the rate of sampling of central k-space or temporal compression and the frequency of images or speed for the imaging sequence. Typically, the parameter, which may be selected by the healthcare practitioner, is a judgment call by a healthcare practitioner based on the previous experience, protocol, patient characteristics, region of interest, imaging system, local variations, etc., for the best balance between the spatial resolution and temporal resolution provided by the keyhole or central k-space sampling.

The following discloses a new and improved adaptive keyhole compression which addresses the above referenced issues, and others.

In accordance with one aspect of the present invention, a magnetic resonance imaging system includes a sequence control unit, a sampling unit, and a control unit. The sequence control unit controls a magnetic resonance scanner to acquire compressed magnetic resonance data from an imaged region of a subject. The sampling unit determines a change in a concentration of a contrast agent present in the image region of the subject based on magnetic resonance signals received by a radio frequency receiver. The control unit adjusts a degree of compression of the acquired magnetic resonance data based on the determination made by the sampling unit.

In accordance with another aspect of the present invention, a method of magnetic resonance imaging with a contrast agent includes acquiring compressed magnetic resonance data from an imaged region of a subject. A change in a concentration of a contrast agent present in the image region of the subject is determined based on acquired magnetic resonance data. The degree of compression of the acquiring magnetic resonance data us adjusted based on the determined change in concentration of the contrast agent.

For example, acquiring compressed magnetic resonance data can include fully sampling a central region of k-space and partially sampling a peripheral region of k-space. Adjusting the degree of compression can include adjusting a proportion of k-space which is fully sampled. Determining can include determining a rate of change of one or more central data line of k-space. It is also possible that adjusting the degree of compression includes decreasing a size of the central portion of k-space in response to determining an increase in the rate of change in the concentration of the contrast agent. The exemplary method can also include reconstructing a series of images of the imaged region of the subject, the images having greater temporal resolution and lower spatial resolution when the sampling unit determines a faster change in the change in the concentration of the contrast agent and a lower temporal resolution and a higher spatial resolution when the sampling unit determines a slower change in the concentration of the contrast agent.

Further, in accordance with another aspect of the present invention, provided is a non-transitory computer-readable storage medium carrying software which controls one or more electronic data processing devices to perform the exemplary method provided herein.

Further still, in accordance with another aspect of the present invention, provided is an electronic data processing device configured to perform the exemplary method provided herein.

In accordance with yet another aspect of the present invention, a magnetic resonance imaging system includes a data acquisition unit, a reconstruction unit, and a control unit. The data acquisition unit excites resonance in an image region of a subject in which a contrast agent is injected, the data acquisition unit alternately (a) fully sampling a central region of k-space and (b) partially sampling a peripheral region of k-space. The reconstruction unit reconstructs each central region of k-space and a preceding and following peripheral region of k-space into a series of reconstructed images. The control unit controls the acquisition unit to increase or decrease the fully sampled central region of k-space based on the changes in concentration of the contrast agent determined by the sampling unit to adaptively (a) increase temporal resolution and decrease spatial resolution and (b) increase spatial resolution and decrease temporal resolution of the series of reconstructed images.

One advantage is balancing the spatial and temporal resolution of dynamic contrast images based on observed data.

Another advantage resides in improving the temporal resolution by matching changes in contrast agent with corresponding changes in the sampling of central k-space.

Another advantage resides in improving the spatial resolution with sampling of non-central k-space when the contrast agent is not present or not changing.

Another advantage resides in use of existing hardware, software, and protocols.

Still further advantages will be appreciated to those of ordinary skill in the art upon reading and understanding the following detailed description.

The invention may take form in various components and arrangements of components, and in various steps and arrangement of steps. The drawings are only for purposes of illustrating the preferred embodiments and are not to be construed as limiting the invention.

FIG. 1 diagrammatically illustrates an example of reconstructions using adaptive keyhole compression or shared k-space.

Figure 2:
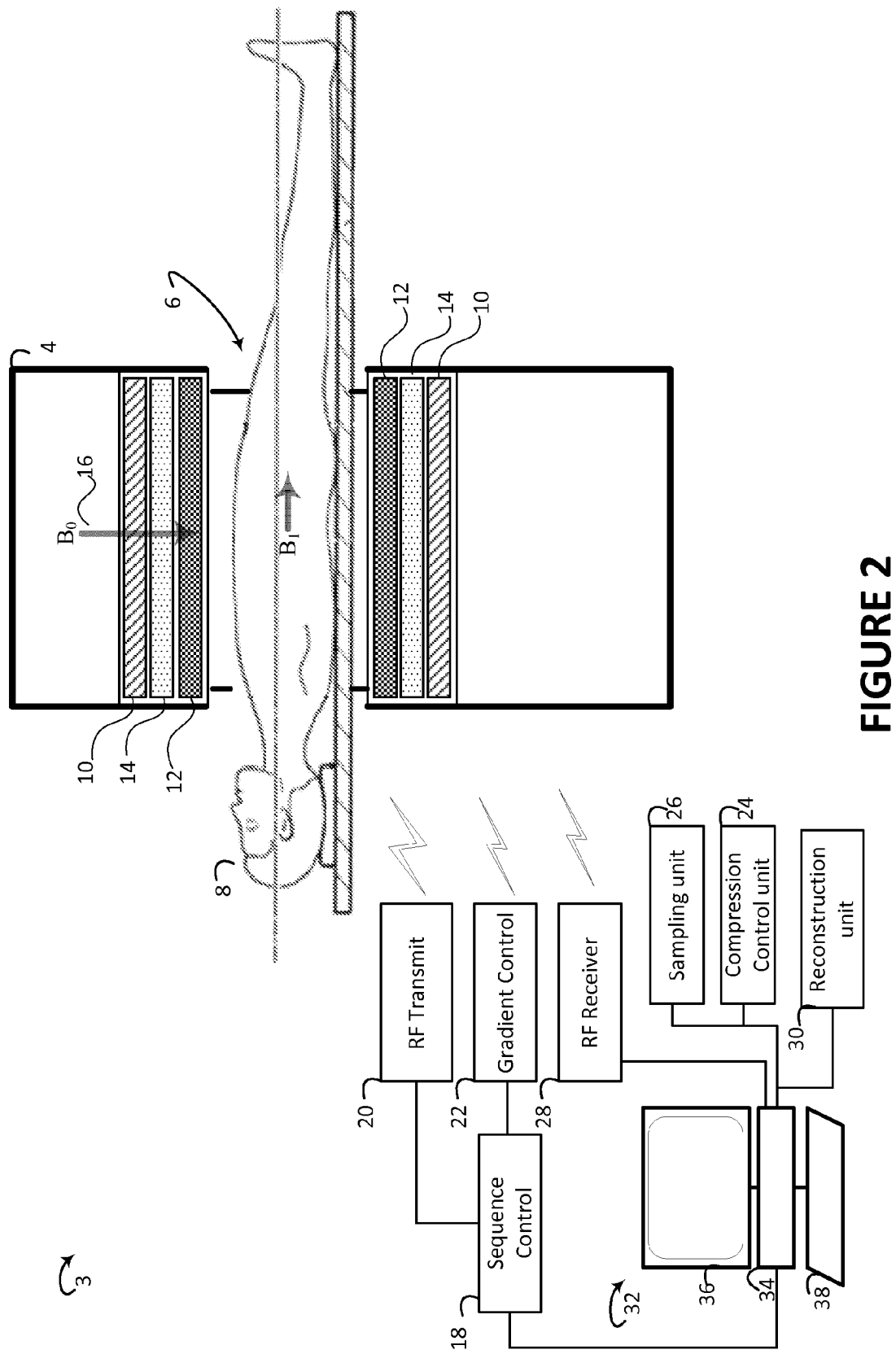

FIG. 2 schematically illustrates one embodiment of a magnetic resonance system with adaptive keyhole compression.

Figure 3:
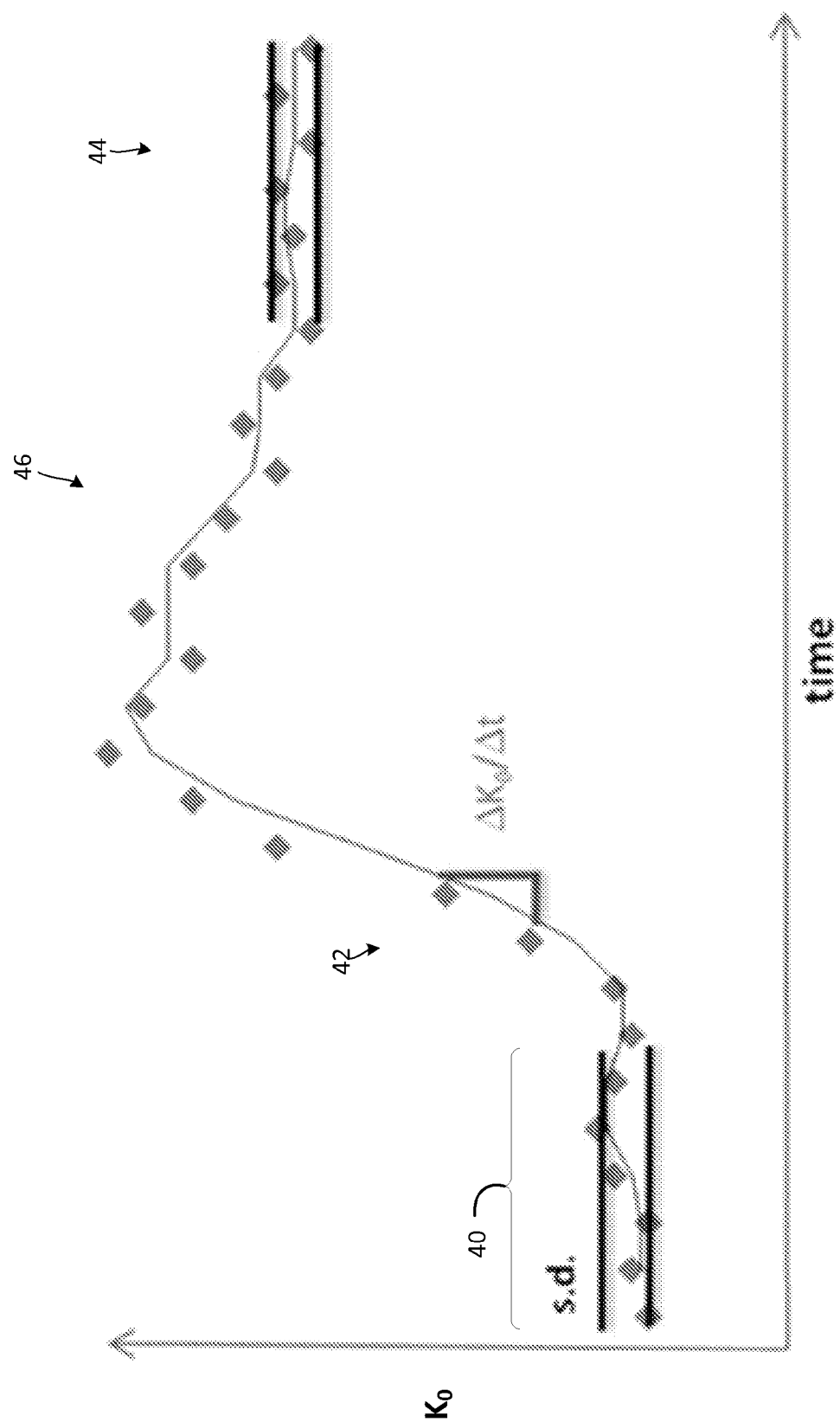

FIG. 3 illustrates an exemplary $K_0$ intensity versus time plot.

Figure 4:
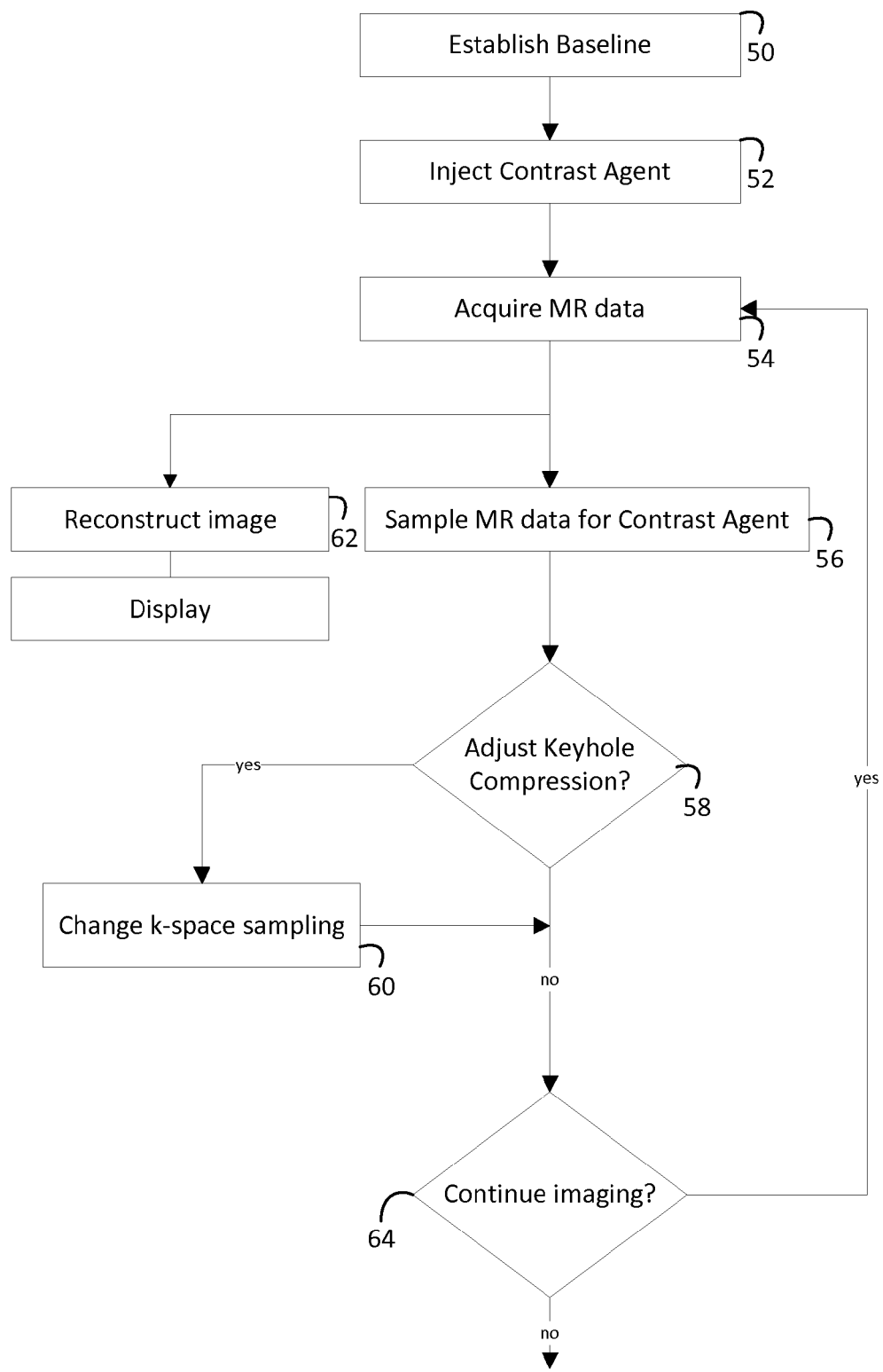

FIG. 4 flowcharts one embodied method of using adaptive keyhole compression.

With reference to FIG. 1, an example of reconstructions using adaptive keyhole compression or shared k-space is diagrammatically illustrated. K-space is divided into a central portion or keyhole and peripheral portion(s). The divisions can be further sub-divided into finer delineations. The geometry of the divisions of k-space can be selected and visualized as concentric geometric shapes, a grid format, or a combination. The order of sampling can be varied. In the illustrated example, the central portion and half of the peripheral portion are sampled alternately. In the example shown, k-space is divided into three portions: central, peripheral, and reference or far peripheral. The central region C is fully sampled. Sampling of the peripheral portions may include only certain portions of peripheral k-space, e.g. alternate halves or fractions less than a half. For instance, sampling may alternate between near and far peripheral portions of k-space, alternate data lines, sampling near portions more frequently than far portions, and the like. By combining the central k-space data with preceding and subsequent sampled peripheral regions, a substantially complete sampling of k-space is provided.

Sharing of k-space in the example includes interleaving of sampled peripheral k-space P. The example shows a sampling of peripheral k-space alternating with a sampling of central k-space C and ends with a sample of the reference or more peripheral portions k-space Ref. Three dynamic images are shown reconstructed each from one sampled central k-space portion and two sampled and shared peripheral k-space portions. The peripheral k-space portions are shared with the prior and subsequent images. Each image reconstructed, shown as Dyn 1, Dyn 2, and Dyn 3 can be represented as reconstructed from a sampling sequence P-C-P with P representing a peripheral k-space sample, and C representing a central k-space sample. The three image sequence can be represented as P-C-P-P-C-P-P-C-P, which is compressed with the keyhole sharing into P-C-P-C-P-C-P where P is shared between images.

The amount of sharing of k-space, or the amount of compression of time by sharing k-space can be represented as a variable or parameter. For example, in a sampling sequence P'-P"-C-P"-P' can be compressed with P' only shared or further compressed with P' and P" shared, where P' and P" are different portions of the peripheral k-space P. The further the compression, the greater the temporal resolution. The variable can be a value of zero or no compression when no peripheral k-space portions are shared. The variable can range and include 100% when all or the maximum number peripheral portions of k-space are shared. The maximum number can be set to include a minimum amount of peripheral k-space sampling in order to provide a minimum amount of spatial resolution.

Unlike prior systems, the relative size of the central portion of k-space C and the peripheral portion of k-space P are dynamically adjusted. More specifically, the size of the central portion of k-space C is reduced for higher temporal resolution when the contrast agent is moving quickly and the size of the central portion of k-space C is increased for better spatial resolution when there is little change in the image data. A module, processor, or other means 1 monitors a rate of change in the image data. In one embodiment, the module, processor, or other means 1 compares the central portion of k-space, particularly the center or k=0 data line, in each central portion of k-space acquisition to determine how quickly it is changing. Based on the rate of change, a data acquisition control module, processor, or other means 2 adjusts the size of the central portion of k-space C in subsequent acquisitions.

In one embodiment, the center portion C is fully sampled and the peripheral portion P is undersampled. The rate at which the center is changing controls the relative proportion of k-space that is fully sampled and undersampled as well as the degree of undersampling. Complex conjugate k-space data can be used for faster temporal resolution.

FIG. 2 schematically illustrates one embodiment of a magnetic resonance system with adaptive keyhole compression. The system 3 includes a magnetic resonance scanner 4 such as a horizontal bore scanner, open system or c-type scanner, and the like shown in a cross section view. The scanner includes an opening 6 or bore that defines an examination region in which a subject 8 is placed for a spectroscopic and/or imaging examination. The MR scanner 4 includes a main magnet 10, one or more radio frequency (RF) coils 12, and one or more gradient coils 14. The main magnet 10 generates a static $B_0$ field 16 such as vertical main field or horizontal main field.

The system 3 includes a sequence controller 18 which controls the operation of the imaging sequence, a RF transmitter unit 20 controlling the operation of the RF coils 12, and a gradient controller 22 controlling the operation of the gradient coils 14. The communication between the controlling unit and the corresponding coils can be wireless or wired. The RF coils 12 generate radio frequency pulses which excite and manipulate resonance in tissue of the subject 8. The RF coils 12 can include a whole body coil and/or a local coil such as a torso coil, head coil, hand coil, knee coil, prostate coil, etc. The one or more gradient coils 10 generate gradient magnetic fields across the static magnetic field and spatially encode the induced resonance, induced gradient echoes, and the like. The sequence controller 18 configures the RF coils and the gradient coils to sample k-space, e.g. radially, in Cartesian coordinates, along a spiraling trajectory, or the like. The specific portions and sequence of k-space to be sampled are determined by a compression control unit 24 based on information from a sampling unit 26 and an order of k-space sampling. The information from the sampling unit 26 includes measures of the concentration and/or change in concentration of a contrast agent.

The system 3 includes a RF receiver unit 28, which receives magnetic resonance (MR) signals. As the resonance decays in the tissue of the subject, weak radio frequency signals or magnetic resonance signals are received by a radio frequency antenna such as the RF coils 12 and transmitted to the RF receiver unit 28. The sampling unit 26 samples the received MR signals. Before injecting the contrast agent, a baseline is established such as by generating a contrast agent free baseline or a reference image. The baseline can include a measured signal such as $K_0$ signal intensity. After injecting the contrast agent, the sampling continues to generate a series of images, e.g. in a cine mode, depicting evolution of a distribution of the contrast agent in the anatomical tissue. The sampled MR signals include the central portion of the k-space C, which includes and is contiguous to a center data line $K_0$, typically with zero phase encoding. The contrast agent produces a strong MR signal. The strong MR signal from the contrast agent contrasts with the anatomical regions, typically the contrast agent is displayed either bright or black in the anatomical image. The sampling unit 26 provides the information about the change, particularly the rate of change in the distribution of the contrast agent based on the changes in the central portion of k-space data, particularly the center most data $K_0$. The compression control unit adjusts the sampling order of k-space based on the rate of change in the central portion of k-space, particularly $K_0$, to enlarge the central portion of k-space for high spatial resolution of to reduce size of the central portion of k-space for higher temporal resolution. Temporal resolution can be further improved by reducing the amount of data collected in the peripheral region, i.e. collecting the peripheral data more sparsely. A reconstruction unit 30, such as a processor, receives RF data or MR signals from the RF receiver 28 and reconstructs a series of contrast enhanced images from the received data.

The system includes a workstation 32, which includes the user interface. The workstation 32 includes an electronic processor or electronic processing device 34, a display 36 which displays the reconstructed images, menus, panels, and user controls, and the at least one input device 38 which inputs the healthcare practitioner selections. The workstation 32 can be a desktop computer, a laptop, a tablet, a mobile computing device, a smartphone, and the like. The input device can be a keyboard, a mouse, a microphone, and the like.

The various units or controllers 18, 22, 24, 26, 30 are suitably embodied by an electronic data processing device, such as the electronic processor or electronic processing device 34 of the workstation 32, or by a network-based server computer operatively connected with the workstation 32 by a network, or so forth. Moreover, the disclosed sampling and compression techniques are suitably implemented as a non-transitory storage medium storing instructions (e.g., software) readable by an electronic data processing device and executable by the electronic data processing device to perform the disclosed k-space sharing, time compression, and sampling techniques.

A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer-readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. References to a computer-readable storage medium should be interpreted as possibly being multiple computer-readable storage mediums. Various executable components of a program or programs may be stored in different locations. The computer-readable storage medium may for instance be multiple computer-readable storage medium within the same computer system. The computer-readable storage medium may also be computer-readable storage medium distributed amongst multiple computer systems or computing devices.

'Computer memory' or 'memory' is an example of a computer-readable storage medium. Computer memory is any memory which is directly accessible to a processor. Examples of computer memory include, but are not limited to: RAM memory, registers, and register files. References to 'computer memory' or 'memory' should be interpreted as possibly being multiple memories. The memory may for instance be multiple memories within the same computer system. The memory may also be multiple memories distributed amongst multiple computer systems or computing devices.

'Computer storage' or 'storage' is an example of a computer-readable storage medium. Computer storage is any non-volatile computer-readable storage medium. Examples of computer storage include, but are not limited to: a hard disk drive, a USB thumb drive, a floppy drive, a smart card, a DVD, a CD-ROM, and a solid state hard drive. In some embodiments computer storage may also be computer memory or vice versa. References to 'computer storage' or 'storage' should be interpreted as possibly being multiple storage. The storage may for instance be multiple storage devices within the same computer system or computing device. The storage may also be multiple storages distributed amongst multiple computer systems or computing devices.

A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins by the antenna of a Magnetic resonance apparatus during a magnetic resonance imaging scan. A Magnetic Resonance Imaging (MRI) image is defined herein as being the reconstructed two or three dimensional visualization of anatomic data contained within the magnetic resonance imaging data. This visualization can be performed using a computer.

In FIG. 3 an exemplary center line $K_0$ intensity versus time plot is illustrated. The $K_0$ intensity determined from the sampled signal from the central portion of k-space or average intensity from the central portion of k-space. The plot is illustrative of the information processed by the sampling unit 26. The diamond shaped points represent sampled points measured based on the signal intensity. The plot shows an initial period 40 where the $K_0$ signal is low and the threshold can be established. Alternatively, a fixed amount or a relative amount changed can be used. At this time, the system operates with minimal or no compression. Spatial resolution is maximized by maximizing the amount of fully sampled k-space, i.e. maximizing the size of the central portion of k-space C. After injection of the contrast agent, the $K_0$ signal increases 42 indicative of an increase in the concentration or change in concentration of the contrast agent as the contrast agent moves through the tissue of the subject. As the concentration of the contrast agent increases, the compression control unit 24 correspondingly decreases the proportion of k-space that is assigned to the central portion of k-space C to be fully sampled as described in reference to FIG. 1. The decrease in the portion of k-space that is fully sampled, i.e. the size of the central k-space, improves the temporal resolution. Alternatively, a stepwise amount can be used to control the keyhole compression or central k-space sampling, a curve fitted and used to compute a change in the sample of central k-space, etc. The concentration of the contrast agent is repeatedly sampled based on the signal intensity and its rate of change calculated and the sampling of central k-space modified by the compression control unit 24 through the sequence controller 18 accordingly. With the change in sampling of central k-space or keyhole compression, the system adapts to the increase in concentration of the contrast agent by increasing the temporal resolution. This removes guesswork by the healthcare practitioner even with systems having a user parameter as to the proper setting while the contrast agent is being monitored.

As the rate of change of $K_0$ signal begins to stabilize with the diffusion of the contrast agent, a high temporal resolution becomes less important and the central region k-space can be increased to improve spatial resolution at the expense of the temporal resolution. In an ending period 44, the contrast agent is diffused and remains constant within a threshold. High temporal resolution may be important during a wash-out period 46 as well as during the uptake period 42. For example, the imaging sequence may focus on leakage and thus the ending period can include high temporal resolution to identify changes. Alternatively, the initial diffusion can be the initial focus and spatial resolution desirable for the ending period. As another example, a rate at which tissue uptakes glucose associated with a contrast agent and a rate at which tissue burns the glucose and the contrast agent washes out, can both be important for diagnosing some types of tumors. The system can determine from the protocol or information from the healthcare practitioner which options to perform.

FIG. 4 flowcharts one embodied method of using adaptive keyhole compression. In a step 50, a baseline is established. The baseline can include an assigned value and/or include a sampling of k-space, or central k-space such as $K_0$. The sampling of central k-space can include a statistical measure of the received MR signal over the sampled central k-space, and/or over time. The initial sampling algorithm of k-space is configured with the compression control unit 24 and communicated to the sequence control unit 18. The sampling of k-space can include a default algorithm or order. A contrast agent is injected into the subject to contrast movement in a region of interest in a step 52.

MR data is acquired in a step 54. The sequence controller controls the RF transmitter 20 and the gradient control 22 to operate the RF coils and gradient coils to excite and refocus resonance in the tissue of subject. The application of the gradient fields and the RF pulse determines the sampling of k-space. The MR data is acquired by the RF receiver 28. In a step 56, the received MR data is sampled for the contrast agent by the sampling unit 26. For example, the sampling unit can evaluate the signal intensity of the $K_0$ in k-space. The sampling unit determines the concentration or change in concentration of the contrast agent based on the sampled MR data.

In a step 58, a decision is made whether to adjust the keyhole compression or size of the central portion of k-space sampled based on the concentration or change in concentration of the contrast agent determined by the sampling unit. The decision can include meeting a threshold amount of contrast agent and/or a change in concentration over time of the contrast agent. If the decision to adjust the keyhole compression is made then a change is made to the sampling order of k-space in a step 60. The change is made to the sampling of central portion of k-space by the compression control unit 24. The change to the sample order of k-space or the keyhole compression algorithm can include a function of the change in concentration of the contrast agent sampled. The function can include a stepwise function, fitted curve, proportional function, and the like. The function can include the maximum rate and extend for a predetermined period or operate to float with increases/decreases in the concentration of the contrast agent. For example in a stepwise mode, each 20% increase in contrast agent results in a 20% decrease in the size of the portion of central k-space, i.e. the fully sampled central portion of k-space C is decreased and the under sampled peripheral portion is increased. This results in a corresponding increase in speed in image reconstruction and temporal resolution. In another example, stabilization of the contrast agent concentration as $\Delta K_0/\Delta t$ approaches zero, results in a corresponding increase in size of central portion of k-space and/or more of the peripheral portion of k-space being fully or more fully sampled.

After each sampling, an image is reconstruction in a step 62. The reconstruction uses the data from the central portion of k-space C and the preceding and following complimentary samplings of the peripheral portion of k-space P as well as the reference portion of k-space Ref to reconstruct each image. A decision step 64, determines whether to repeat the process of acquiring data, sampling for the contrast agent, adjusting the sampling order of k-space and reconstructing images. The process can continue until terminated by user input by the healthcare practitioner, until all or a selected portion of the contrast agent washes out, or the like.

It is to be appreciated that in connection with the particular illustrative embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

What is claimed is:

1. A magnetic resonance imaging system, comprising:
a sequence control unit configured to control a magnetic resonance scanner to perform dynamic imaging by acquiring compressed magnetic resonance data from an imaged region of a subject including fully sampling a central portion of k-space and partially sampling a peripheral portion of k-space;
a sampling unit which determines a rate of change in a concentration of a contrast agent present in the image region of the subject during the dynamic imaging based on magnetic resonance signals received by a radio frequency receiver; and
a control unit which adjusts a degree of compression of the acquired magnetic resonance data during the dynamic imaging based on the determination made by the sampling unit;
wherein the control unit adjusts gradient fields to decrease the central portion of k-space and increase the peripheral portion of k-space in response to an increase in the rate of change in the concentration of the contrast agent and adjusts the gradient fields to increase the central portion of k-space and decrease the peripheral portion of k-space in response to a decrease in the rate of change in the concentration of the contrast agent.

2. The system according to claim 1, wherein the sampling unit determines a rate of change of one or more central data lines of k-space.

3. The system according to claim 1, wherein the sampling unit determines a difference between consecutive central k-space ($K_0$) intensities.

4. The system according to claim 3, wherein the control unit decreases a completeness with which k-space is sampled in response to the sampling unit determining an increase in the rate of change in the concentration of the contrast agent.

5. The system according to claim 4, wherein an order of sampling of a central k-space and portions of peripheral k-space is changed in response to a change in the concentration of the contrast agent.

6. The system according to claim 5, wherein a frequency of sampling of a peripheral region of k-space changes in response to the change in the concentration of the contrast agent.

7. The system according to claim 6, wherein a number of data lines in central k-space changes in response to a change in the concentration of the contrast agent after an initial threshold in the concentration of the contrast agent.

8. The system according to claim 7, further including:
a reconstruction processor which reconstructs a series of images of the imaged region of the subject, the images having greater temporal resolution and lower spatial resolution when the sampling unit determines a faster change in the change in the concentration of the contrast agent and a lower temporal resolution and a higher spatial resolution when the sampling unit determines a slower change in the concentration of the contrast agent.

9. A method of magnetic resonance imaging with a contrast agent, comprising:
- performing dynamic imaging by acquiring, from a magnetic resonance scanner, compressed magnetic resonance data from an imaged region of a subject wherein a degree of compression is controlled by a proportion of k-space which is fully sampled;
- determining a rate of change in a concentration of a contrast agent present in the image region of the subject during the dynamic imaging based on the acquired magnetic resonance data; and
- adjusting the degree of compression of the acquiring magnetic resonance data during the dynamic imaging based on the determined rate of change in concentration of the contrast agent;
- wherein the adjusting includes:
  - if the rate of change in the concentration of the contrast agent increases, decreasing the proportion of k-space which is fully sampled; and
  - if the rate of change in the concentration of the contrast agent decreases, increasing the proportion of k-space that is fully sampled.

10. The method according to claim 9, wherein acquiring compressed magnetic resonance data includes fully sampling a central region of k-space and partially sampling a peripheral region of k-space.

11. The method according to claim 9, wherein determining includes determining a rate of change of one or more central data lines of k-space, and wherein adjusting the degree of compression includes decreasing a size of the central portion of k-space in response to determining an increase in the rate of change in the concentration of the contrast agent, the method further comprising:
- reconstructing a series of images of the imaged region of the subject, the images having greater temporal resolution and lower spatial resolution when the sampling unit determines a faster change in the change in the concentration of the contrast agent and a lower temporal resolution and a higher spatial resolution when the sampling unit determines a slower change in the concentration of the contrast agent.

12. The method according to claim 9, wherein the adjusting further includes adjusting gradient fields to decrease a central portion of k-space and increase a peripheral portion of k-space in response to an increase in a rate of change in the concentration of the contrast agent.

13. The method according to claim 9, wherein the adjusting further includes adjusting the gradient fields to increase the central portion of k-space and decrease the peripheral portion of k-space in response to a decrease in the rate of change in the concentration of the contrast agent.

14. A magnetic resonance imaging device comprising:
- a magnetic resonance scanner configured to perform dynamic imaging by acquiring compressed magnetic resonance data from an imaged region of a subject with an amount of compression controlled by a degree of undersampling of k-space; and
- a computer programmed to:
  - determine a rate of change in the acquired compressed magnetic resonance data during the dynamic imaging;
  - increase the amount of compression in response to a higher rate of change in the acquired compressed magnetic resonance data; and
  - decrease the amount of compression in response to a lower rate of change in the acquired compressed magnetic resonance data.

15. The magnetic resonance imaging device of claim 14 wherein the computer is programmed to determine the rate of change in the acquired compressed magnetic resonance data during the dynamic imaging as a rate of change in magnetic resonance signal intensity.

16. The magnetic resonance imaging device of claim 14 wherein the computer is programmed to determine the rate of change in the acquired compressed magnetic resonance data during the dynamic imaging as a rate of change in magnetic resonance signal intensity $K_0$ for a central line of k-space.

17. The magnetic resonance imaging device of claim 14 wherein the computer is programmed to determine the rate of change in the acquired compressed magnetic resonance data during the dynamic imaging as a rate of change in a distribution of contrast agent in the imaged region of the subject determined from change in a magnetic resonance signal intensity at a central portion or line of k-space.

* * * * *